(12) United States Patent
Li et al.

(10) Patent No.: US 7,782,614 B2
(45) Date of Patent: Aug. 24, 2010

(54) HEAT DISSIPATION MODULE

(75) Inventors: Shu-Min Li, Shenzhen (CN); Xin-Xiang Zha, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/476,243

(22) Filed: Jun. 1, 2009

(65) Prior Publication Data
US 2010/0124011 A1      May 20, 2010

(30) Foreign Application Priority Data
Nov. 14, 2008    (CN) .................. 2008 1 0305554

(51) Int. Cl.
*H05K 7/20*       (2006.01)
(52) U.S. Cl. .............. 361/695; 361/697; 165/80.3; 165/122; 165/185
(58) Field of Classification Search ............. None
See application file for complete search history.

(56) References Cited

U.S. PATENT DOCUMENTS

| | | | | | |
|---|---|---|---|---|---|
| 5,074,751 | A | * | 12/1991 | Sixsmith | 415/206 |
| 5,309,983 | A | * | 5/1994 | Bailey | 165/80.3 |
| 5,810,554 | A | * | 9/1998 | Yokozawa et al. | 415/176 |
| 6,050,774 | A | * | 4/2000 | LeBaron | 415/121.2 |
| 6,270,313 | B1 | * | 8/2001 | Chuang et al. | 415/148 |
| 6,459,580 | B1 | * | 10/2002 | Della Fiora et al. | 361/697 |
| 7,120,018 | B2 | * | 10/2006 | Shen et al. | 361/695 |
| 7,351,032 | B2 | * | 4/2008 | Horng et al. | 415/213.1 |

* cited by examiner

*Primary Examiner*—Boris L Chervinsky
(74) *Attorney, Agent, or Firm*—Frank R. Niranjan

(57) ABSTRACT

An electronic device includes a first electronic component, a second electronic component adjacent to the first electronic component, a heat sink arranged on the first electronic component to absorb heat therefrom, an axial fan mounted on the heat sink for generating an airflow to the heat sink, and a guiding member. The axial fan includes a frame and an impeller received in the frame. A cutout is defined in the frame facing the second electronic component. The guiding member is arranged between the axial fan and the second electronic component for guiding a part of the airflow escaping from the frame via the cutout to the second electronic component.

15 Claims, 6 Drawing Sheets

HEAT DISSIPATION MODULE

BACKGROUND

1. Technical Field

The disclosure generally relates to heat dissipation modules, and particularly to a heat dissipation module which can cool plural electronic components of an electronic device simultaneity.

2. Description of Related Art

With developments in technology, portable electronic devices, such as notebook, game player and the like, have decreased both in size and weight over the past few years. However, the electronic components of the electronic devices, such as CPUs and VGA chips, feature increasingly high operating speed and generate more and more heat need to be dissipated immediately.

Conventionally, a heat sink is mounted onto the CPU of the electronic device to absorb heat therefrom, and a fan is assembled onto the heat sink to generate forced airflow to the heat sink. During operation, the forced airflow flows across the heat sink to exchange heat with the heat sink. Thus the airflow is heated and has a relatively higher temperature after flows through the heat sink. Other electronic components around the CPU, such as the VGA chips, the memory modules, can not be efficiently cooled by the heated airflow. Finally, the operation of the electronic device may be influenced.

For the foregoing reasons, therefore, there is a need in the art for a heat dissipation module which overcomes the limitations described.

DETAILED DESCRIPTION

Figure 1:
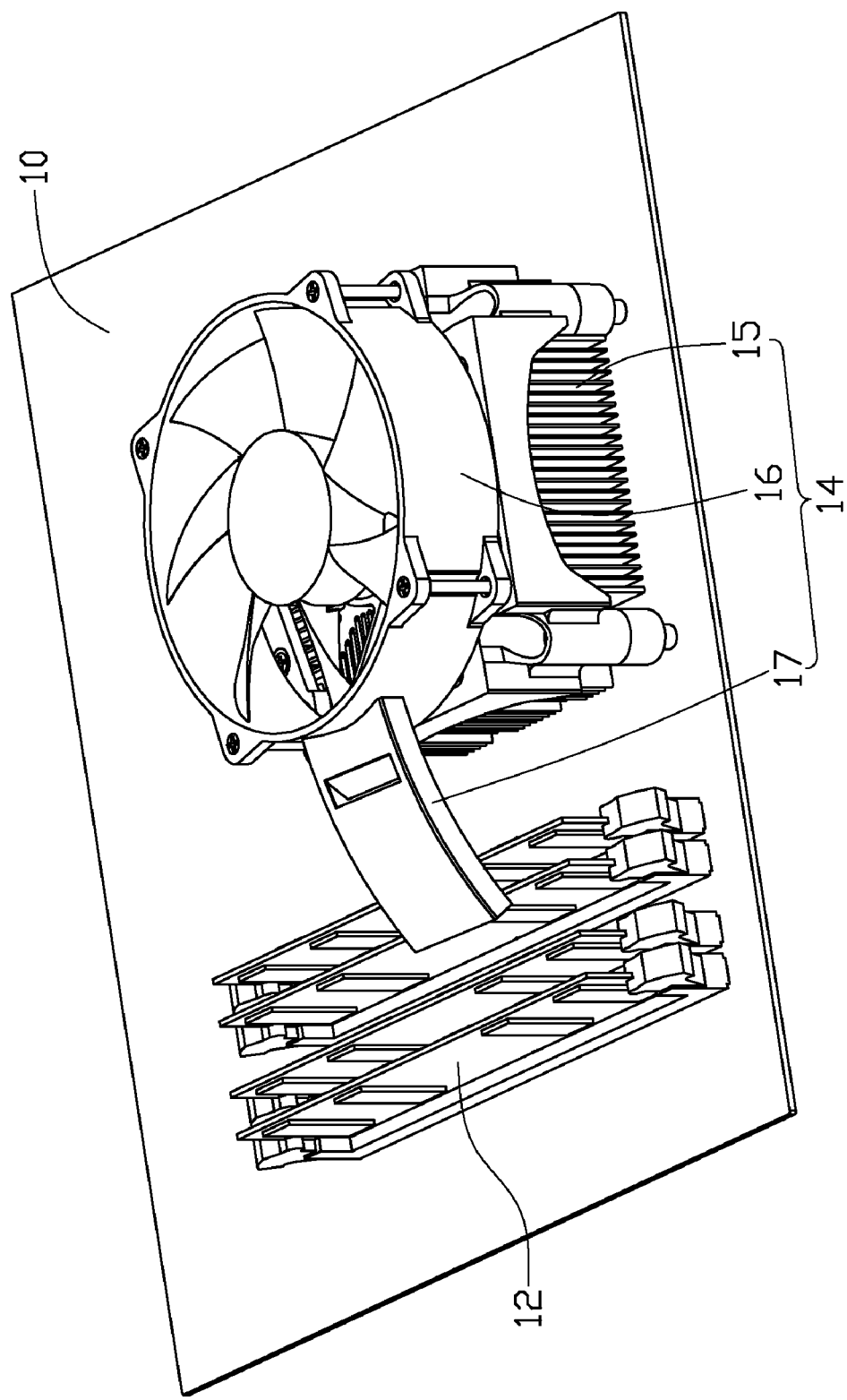
FIG. 1 is an assembled view of a heat dissipation module according to an exemplary embodiment.
Figure 2:
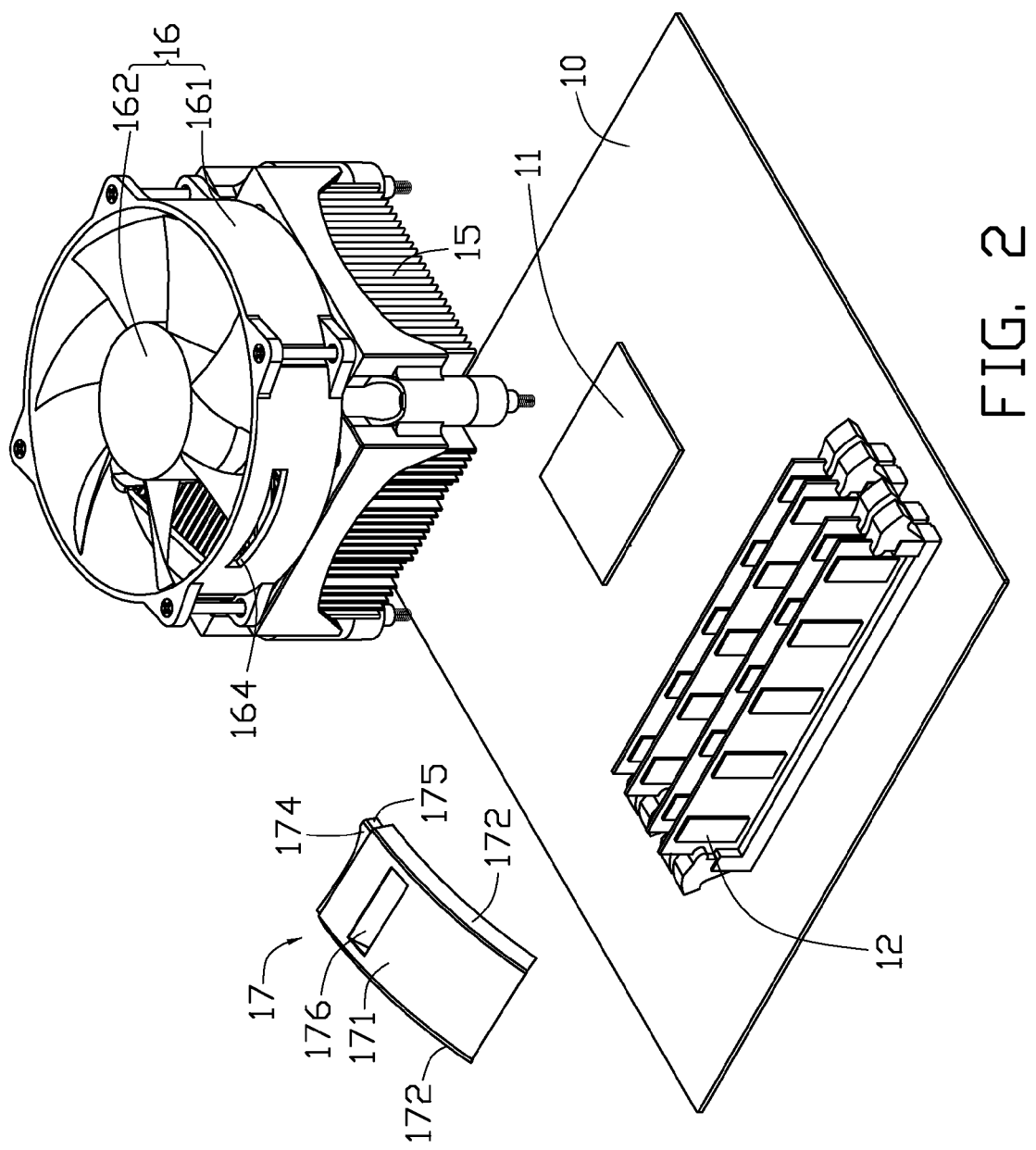
FIG. 2 is an exploded view of the heat dissipation module of FIG. 1.

Referring to FIGS. 1 and 2, a heat dissipation module 14 for cooling plural electronic components of an electronic device at the same time according to an exemplary embodiment is shown. In this embodiment, the heat dissipation module 14 is used in a computer to cool a CPU 11, and at the same time to cool a plurality of memory modules 12 arranged adjacent to the CPU 11. The CPU 11 and the memory modules 12 are set on a circuit board 10 which is received in a casing of the computer. The memory modules 12 are located at a left side of the CPU 11, and include a quantity of four which are evenly spaced from and parallel to each other. Alternatively, the heat dissipation module 14 can be used to cool any other electronic components adjacent to the CPU 11, such as north bridge, south bridge, or the like. In addition, it is to be understood that the heat dissipation module 14 can be used in other electronic device, such as a projector or a game player to cool electronic components thereof.

The heat dissipation module 14 includes a heat sink 15, an axial fan 16, and a guiding member 17. The heat sink 15 is arranged on the CPU 11 to absorb heat therefrom. The axial fan 16 is arranged on the heat sink 15 to generate a forced airflow to the heat sink 15. The guiding member 17 slants from a left side of the axial fan 16 towards the memory modules 12. It is to be understood that the arrangement of the guiding member 17 bases on the location of the memory modules 12, and should be changed corresponding to the electronic component which is located adjacent to the CPU 11 and needs to be cooled. The axial fan 16 includes an annular frame 161, and an impeller 162 received in the frame 161. A cutout 164 is defined in the left side of the frame 161, facing the memory modules 12. Accordingly, a position of the frame 161 to form the cutout 164 is decided according to the location of the memory modules 12. The cutout 164 is elongated along a circumferential direction of the frame 161.

Figure 3:
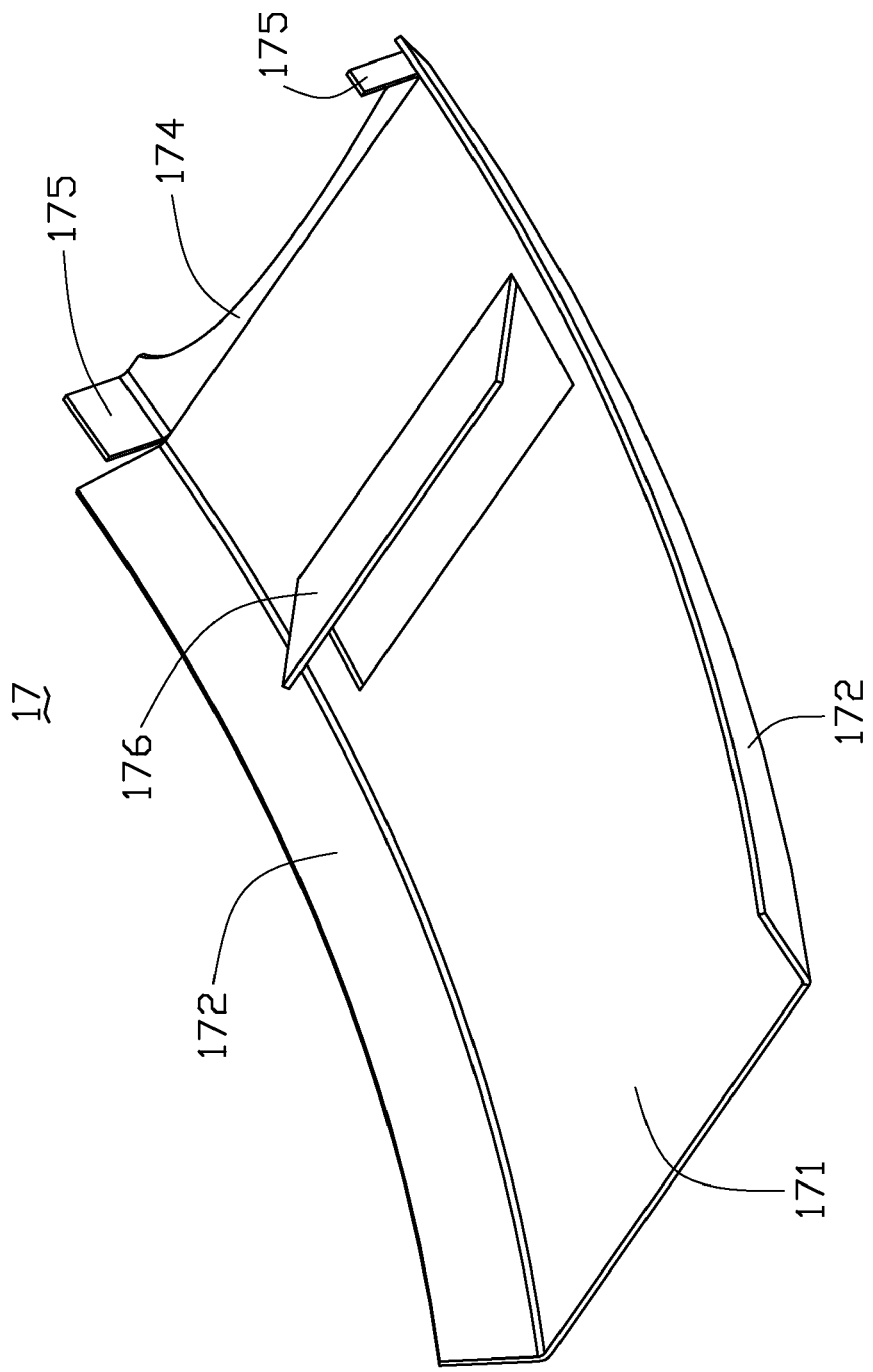
FIG. 3 shows a guiding member of the heat dissipation module of FIG. 1 viewed from another aspect.

Referring to FIG. 3, the guiding member 17 is curved, and includes a main body 171, a pair of wings 172, an engaging portion 174, and a tongue 176. The main body 171 is convex, and slants from an upper, right position to a lower, left position. In other words, a right end of the main body 171 adjacent to the axial fan 16 is higher than a left end of the main body 171 adjacent to the memory modules 12. In this embodiment, the left end is located at a middle of the memory modules 12, with two memory modules 12 at a right side thereof, and the other two memory modules 12 at a left side thereof. The wings 172 extend respectively and downwardly from two opposite sides, i.e., front and rear sides, of the main body 171. The wings 172 are aslant. An angle larger than 90 degrees is defined between each wing 172 and the main body 171.

The engaging portion 174 extends from the right end of the main body 171 to the axial fan 16. An end of the engaging portion 174 abutting the axial fan 16 is arc. A pair of latches 175 are formed at front and rear sides of the engaging portion 174. The latches 175 are flexible. During assembly, the latches 175 are compressed by the annular frame 161 defining front and rear ends of cutout 164 towards each other and thus engage into the cutout 164 of the frame 161 of the axial fan 16. Then the latches 175 resiliently abut against the frame 161 tightly to assemble the guiding member 17 onto the axial fan 16. The tongue 176 extends downward and leftward from the main body 171, and is located adjacent to the engaging portion 174. An aperture is defined in the main body 171 corresponding to the tongue 176.

During operation, heat generated by the CPU 11 is transferred to the heat sink 15. The axial fan 16 generates the forced airflow towards the heat sink 15 to exchange heat with the heat sink 15, and thus takes away heat of the CPU 11. For the cutout 164 defined in the frame 161 of the axial fan 16, a small part of the airflow escapes out of the frame 161 through the cutout 164. The guiding member 17 guides the escaped airflow to flow to the memory modules 12. The tongue 176 formed under the main body 171 of the guiding member 17 can divert a part of the escaped airflow downwardly, and thus the diverted part of the escaped airflow flows downwardly to the right two of the memory modules 12. In addition, another part of the escaped airflow flows across the tongue 176 to the other two memory modules 12, which are located left of a free extremity of the guiding member 17. Thus the memory modules 12 are all cooled by the escaped airflow.

Since the escaped airflow flows from the fan 16 to the memory modules 12 directly, not across the heat sink 15, the escaped airflow has a relatively lower temperature. A heat exchange effect between the escaped airflow and the memory modules 12 is thus enhanced. Thus the memory modules 12 adjacent to the CPU 11 can be efficiently cooled while the heat dissipation module 14 cools the CPU 11. Furthermore, since the memory modules 12 usually have a length much larger than that of the CPU 11, the provision of the wings 172 of the guiding member 17 can guide the escaped airflow to flow outwardly (i.e., forwards and rearwards), thereby to increase an heat exchange area between the memory modules 12 and the escaped airflow. Therefore, almost the entire memory modules 12 can be directly cooled by the escaped airflow which has a relatively low temperature.

Figure 4:
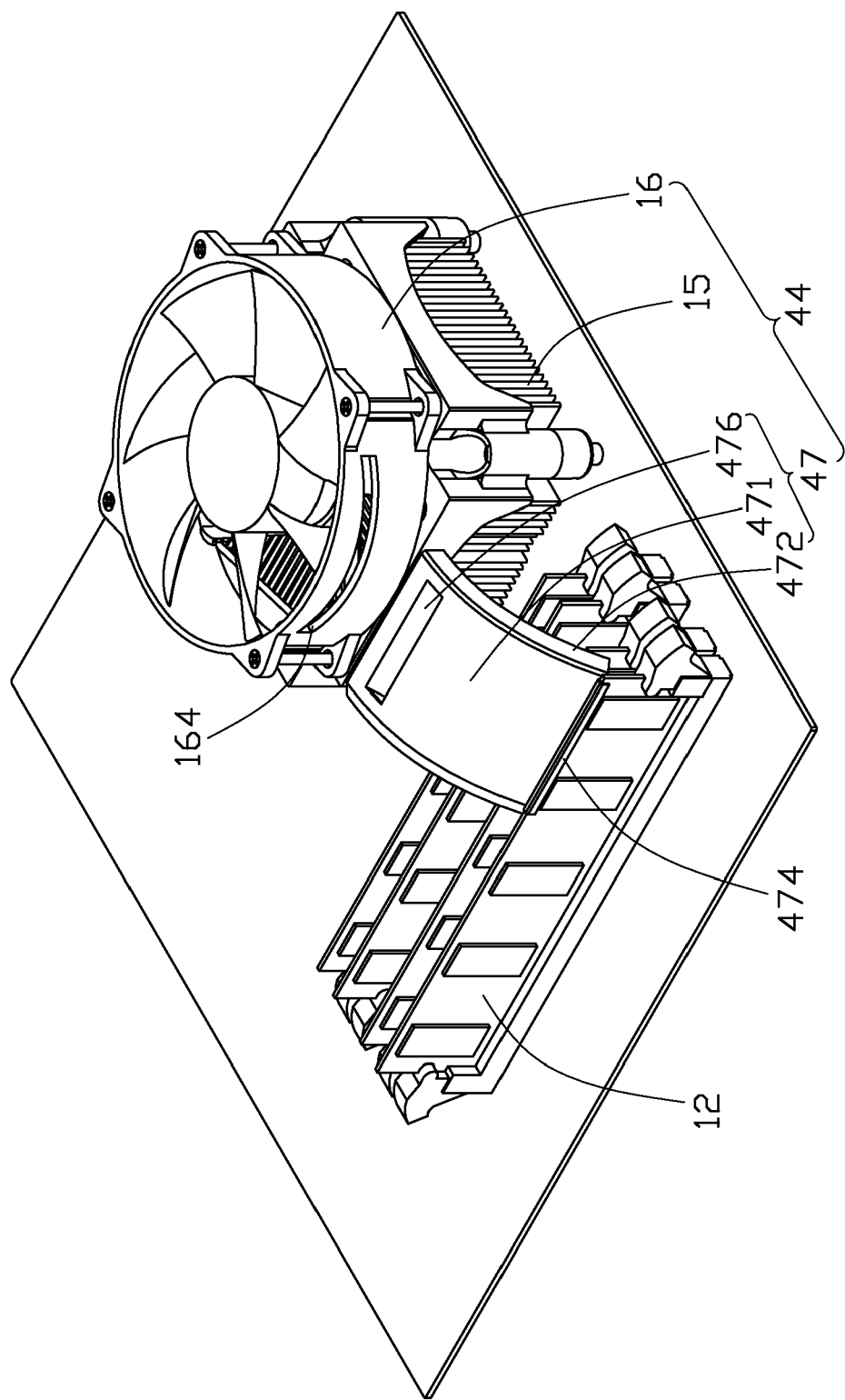
FIG. 4 is a heat dissipation module in accordance with an alternative embodiment.
Figure 5:
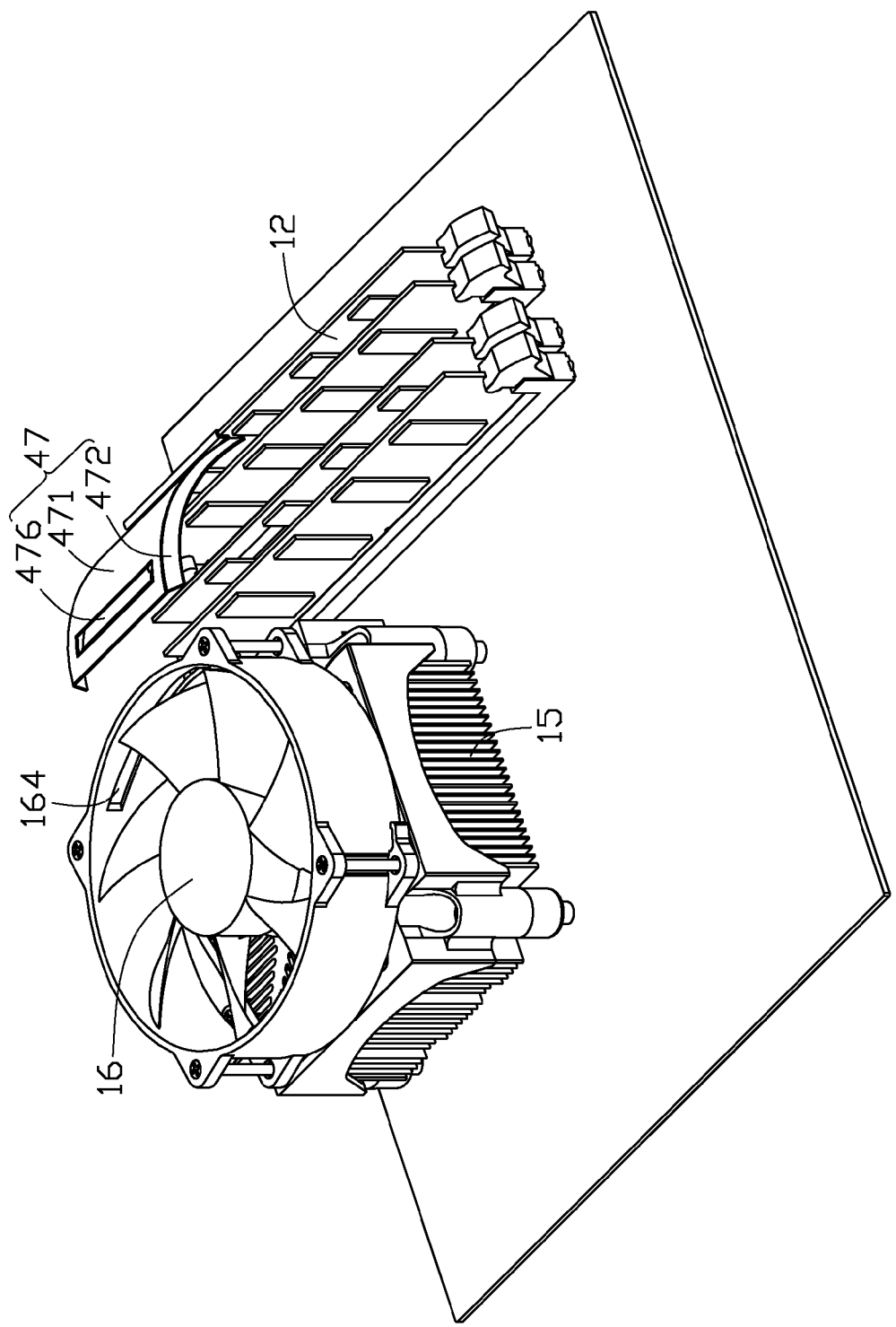
FIG. 5 shows the heat dissipation module of FIG. 4 viewed from another aspect.
Figure 6:
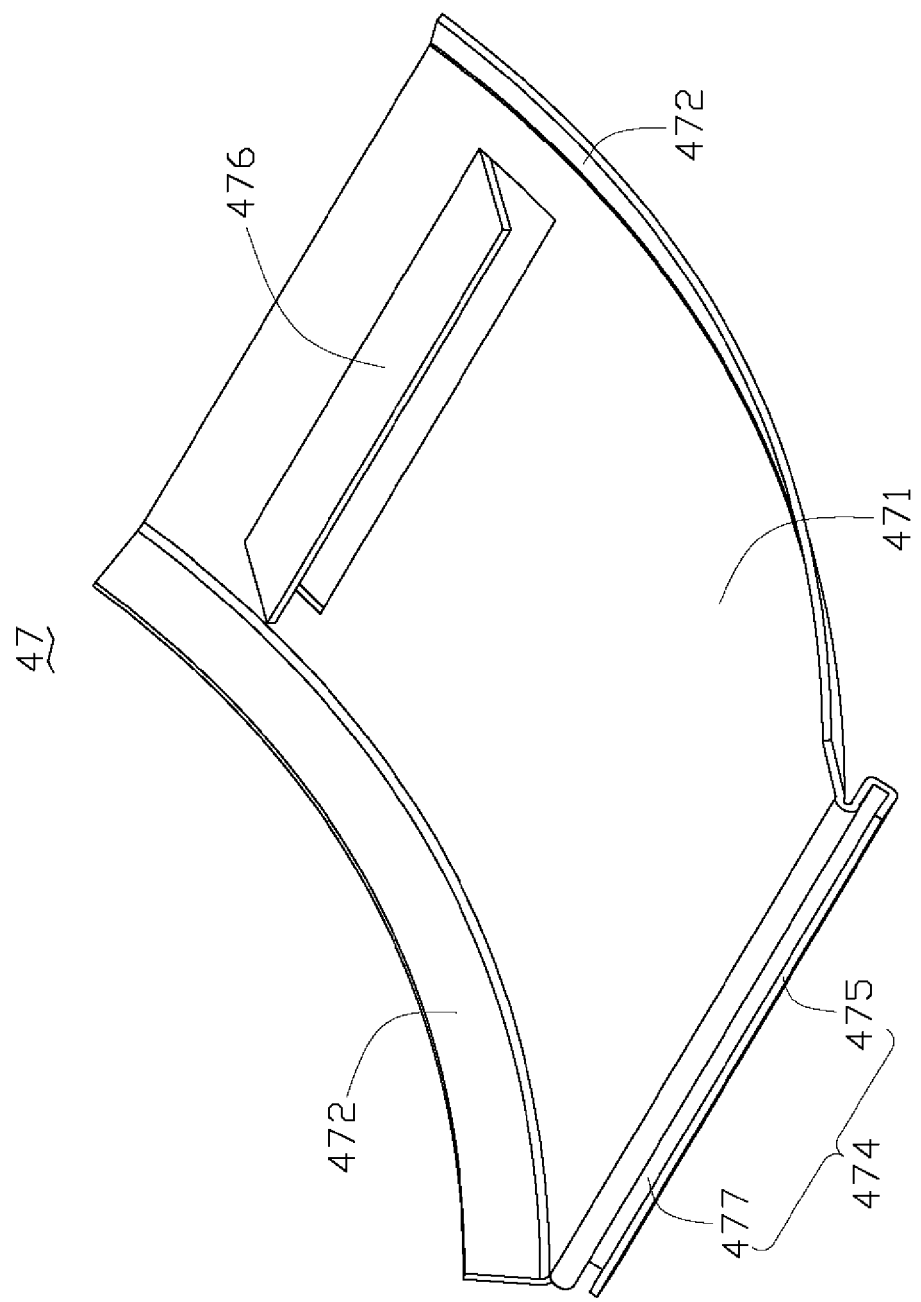
FIG. 6 shows a guiding member of the heat dissipation module of FIG. 4 viewed from a bottom side.

FIGS. 4-6 shows an alternative embodiment of the heat dissipation module 44 which includes a heat sink 15 mounted on the CPU 11, an axial fan 16 arranged on the heat sink 15, and a guiding member 47 for guiding airflow of the axial fan 16 to the memory modules 12. The guiding member 47 includes a main body 471, a pair of wings 472, a tongue 476, and an engaging portion 474. Except the engaging portion 474, the main body 471, the wings 472 and the tongue 476 of the guiding member 47, the axial fan 16 and the heat sink 15 are substantially the same as those of the first embodiment. In this embodiment, unlike the engaging portion 174 of the first embodiment formed at the right end of the guiding member 17, the engaging portion 474 is formed at a left end of the guiding member 47 away from the axial fan 16. The engaging portion 474 is generally n-shaped, and includes a pair of vertical sheets 475. The sheets 475 are spaced from each other at a bottom side, and are connected at a top side. A channel 477 is defined between the sheets 475.

When assembled, the guiding member 47 is secured onto the memory modules 12 with a top of an outmost memory module 12 engaging into the channel 477 of the guiding member 47. A right end of the guiding member 47 adjacent to the cutout 164 of the axial fan 16 is spaced from the axial fan 16. Thus a part of the escaped airflow flows directly towards ends (i.e., rear ends) of the memory modules 12 away from the axial fan 16, and a part of the escaped airflow flows to and along the guiding member 47 to cool the memory modules 12 wherein the guiding member 47 is located near front ends of the memory modules 12. Since the left end of the guiding member 47 is connected to the outmost memory module 12, the escaped airflow flowing along the guiding member 47 can reach all of the memory modules 12. Therefore, the memory modules 12 can be cooled efficiently.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation module, comprising:
    a heat sink;
    an axial fan arranged on the heat sink for generating an airflow to the heat sink, the axial fan comprising a frame and an impeller received in the frame, a cutout being defined in the frame for a part of the airflow to escape from the axial fan via the cutout and
    a guiding member arranged at a lateral side of the axial fan facing the cutout for guiding the part of airflow escaping from the frame via the cutout to the lateral side of the axial fan.

2. The heat dissipation module of claim 1, wherein the guiding member is convex, and extends downwardly in a direction away from the axial fan with a first end of the guiding member adjacent to the axial fan being higher than a second end of the guiding member far from the axial fan.

3. The heat dissipation module of claim 2, wherein the first end of the guiding member is connected to the axial fan, whereby the guiding member and the axial fan are assembled together.

4. The heat dissipation module of claim 3, wherein an engaging portion is formed at the first end of the guiding member to secure the first end of the guiding member to the axial fan, the engaging member comprising a pair of flexible latches engaging into the cutout.

5. The heat dissipation module of claim 2, wherein the first end of the guiding member is spaced from the axial fan, and an engaging portion is formed at the second end of the guiding member for securing the guiding member in position.

6. The heat dissipation module of claim 5, wherein the engaging member is n-shaped, and includes a pair of sheets connected with each other at a top side of the engaging member and spaced from each other at a bottom side of the engaging member, a channel being defined between the pair of sheets.

7. The heat dissipation module of claim 2, wherein a pair of wings are respectively formed at opposite sides of a main body the guiding member along an extending direction of the main body of the guiding member, and an angle larger than 90 degrees is defined between each wing and the main body of the guiding member.

8. The heat dissipation module of claim 2, wherein a tongue extends downwardly from the guiding member, and slants away from the axial fan.

9. An electronic device, comprising:
    a first electronic component;
    a second electronic component adjacent to the first electronic component;
    a heat sink arranged on the first electronic component to absorb heat therefrom;
    an axial fan mounted on the heat sink for generating airflow to the heat sink, the axial fan comprising a frame and an impeller received in the frame, a cutout being defined in the frame facing the second electronic component; and
    a guiding member arranged between the axial fan and the second electronic component for guiding a part of the airflow escaping from the frame via the cutout to the second electronic component.

10. The electronic device of claim 9, wherein the guiding member is convex, and slants downwardly towards the second electronic component with a first end of the guiding member adjacent to the axial fan being higher than a second end of the guiding member adjacent to the second electronic component.

11. The electronic device of claim 10, wherein an engaging portion is formed at the first end of the guiding member to secure the first end of the guiding member to the axial fan, the engaging member comprising a pair of flexible latches engaging into the cutout of the frame of the axial fan.

12. The electronic device of claim 10, wherein the first end of the guiding member is spaced from the axial fan, and an engaging portion is formed at the second end of the guiding member and secured on the second electronic component.

13. The electronic device of claim 12, wherein the engaging member is n-shaped, and includes a pair of sheets connected with each other at a top side of the engaging member and spaced from each other at a bottom side of the engaging member, a channel defined between the pair of sheets engagingly receiving a part of the second electronic component.

14. The electronic device of claim 10, wherein a pair of wings are respectively formed at opposite sides of a main body of the guiding member, and an angle larger than 90 degrees is defined between each wing and the main body of the guiding member.

15. The electronic device of claim 10, wherein a tongue extends downwardly from the guiding member, and slants towards the second electronic component.

* * * * *